United States Patent [19]
Hidese

[11] Patent Number: 5,342,460
[45] Date of Patent: Aug. 30, 1994

[54] OUTER LEAD BONDING APPARATUS
[75] Inventor: Wataru Hidese, Chikushino, Japan
[73] Assignee: Matsushita Electric Industrial Co., Ltd, Osaka, Japan
[21] Appl. No.: 152,063
[22] Filed: Nov. 12, 1993

Related U.S. Application Data

[63] Continuation of Ser. No. 890,307, May 27, 1992, abandoned, which is a continuation of Ser. No. 536,144, Jun. 11, 1990, abandoned.

[30] Foreign Application Priority Data

Jun. 13, 1989 [JP] Japan .................................. 1-151496

[51] Int. Cl.5 ............................................ B32B 31/00
[52] U.S. Cl. ...................................... 156/64; 29/739; 29/740; 29/741; 29/832; 29/833; 29/834; 156/235; 156/355; 156/362; 156/538
[58] Field of Search ................................. 29/739–743, 29/759, 832–836; 156/362, 363, 351, 355, 538, 64, 230, 234, 235, 91, 250, 251

[56] References Cited
U.S. PATENT DOCUMENTS 3,909,933 10/1975 Doubek, Jr. et al. .................. 29/836
4,526,646 7/1985 Suzuki et al. .......................... 29/740
4,675,993 6/1987 Harada ................................... 29/740
4,858,308 8/1989 Komori .................................. 29/739
4,868,977 9/1989 Maruyama et al. .................... 29/739
4,868,978 9/1989 Seidel et al. ........................... 29/740
4,896,418 1/1990 Yearsley ................................ 29/740

FOREIGN PATENT DOCUMENTS 63-20846 1/1988 Japan .

Primary Examiner—David A. Simmons
Assistant Examiner—William J. Matney, Jr.
Attorney, Agent, or Firm—Panitch Schwarze Jacobs & Nadel

[57] ABSTRACT

An outer lead bonding apparatus which includes a device supply section on which devices are arranged at predetermined positions, a transfer head assembly for picking up the devices from the device supply section, means for driving the transfer head assembly in a predetermined direction, a first monitoring camera for checking the devices picked up by the transfer head assembly for its positional exactness, a substrate driving means for moving the substrate in a predetermined direction, and a second monitoring camera for checking the electrodes of the substrate for their positional exactness.

9 Claims, 5 Drawing Sheets

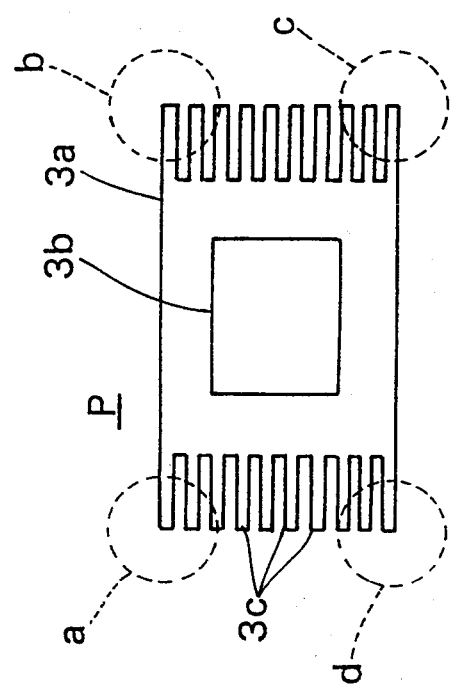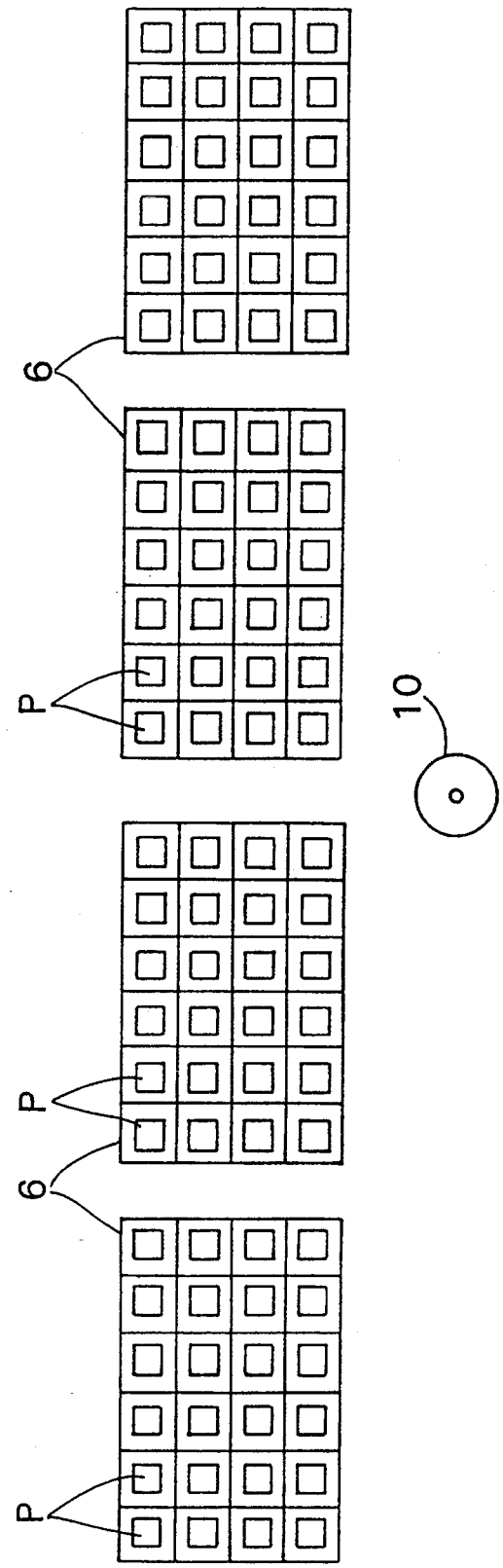

OUTER LEAD BONDING APPARATUS

This application is a continuation of application No. 890,307 filed May 27, 1992 which is now abandoned, which was a continuation of application No. 536,144 filed Jun. 11, 1990 which is now abandoned.

BACKGROUND OF THE INVENTION

1. Field of the Invention

The present invention relates to an outer lead bonding apparatus and, more particularly, to an apparatus for bonding various kinds of devices punched from film carriers to substrates accurately and easily.

2. Description of the Prior Art

An outer lead bonding apparatus is known in the art which bonds outer leads of devices punched from film carriers to frame or substrate (hereinafter referred to as substrate) by aligning the terminals of the outer leads to the electrodes of the substrate. A typical example of the apparatus is disclosed in Japanese Laid-Open Patent Publication (Kokai) No. 63-20846.

The known outer lead bonding apparatus includes film carrier supply reels, and spacer tape wind-up reels within the body. While a film carrier is being drawn from each supply reel, desired devices having outer leads are punched from the film carrier by means of a cutting tool such as a punch, and the devices are then conveyed by a suction or vacuum head to a place where they are Joined to substrates.

The known prior art apparatus has the following disadvantages:

(i) The devices punched from the film carrier are transferred to the substrate by means of a single suction means, which takes them up and allows a camera to monitor them for alignment. Then the suction head transfers the devices to the substrates and mounts them thereon. Finally, the suction head returns to a place where it recycles to pick up new devices. The series of operations require a relatively long stroke for the suction head, thereby occupying a large space and consuming time in the bonding work.

(ii) The outer leads of the devices are extremely fine so as to increase the density per unit area. This requires leads of the devices to be joined in exact alignment to the electrodes of the substrate. In order to achieve such bonding precision, it is necessary to increase the magnifying power of the camera to check the outer leads for their positional exactness because the devices punched from the film carrier are likely to be in disorder and cannot be joined to the substrates as they are. However, the increased magnifying power narrows the visual angle of the camera, and the decrease in the visual angle makes it difficult to monitor the devices over a wide range. The non-alignment of the devices is fatal to the outer lead bonding. When the devices are placed on trays, the non-alignment is particularly large.

(iii) Kinds of film carriers vary from device to device, and they are wound on separate reels or placed on separate trays. However, the above-described prior art apparatus cannot mount different types of devices on a substrate at one time, but a number of apparatus must be employed corresponding to that of devices or the reels, suction head, cutting tools, etc. must be changed with every different kind of device.

SUMMARY OF THE INVENTION

The outer lead bonding apparatus of this invention, which overcomes the above-discussed and numerous other disadvantages and deficiencies of the prior art, comprises a device supply section on which devices are arranged at a predetermined position, a transfer head assembly for picking up the devices from the device supply section, means for driving the transfer head assembly in a predetermined direction, a main monitoring camera for checking the devices picked up by the transfer head assembly for its positional exactness, a substrate driving means for moving the substrate in a predetermined direction, and a substrate monitoring camera for checking the electrodes of the substrate for their positional exactness.

In a preferred embodiment, the transfer head assembly is controlled to compensate for any positional deviation of the device on the basis of the monitoring results of the main monitoring camera.

In another preferred embodiment, the substrate driving means is controlled to compensate for any positional deviation of the substrate on the basis of the monitoring results of the substrate monitoring camera.

In a further preferred embodiment, the transfer head assembly comprises a transfer head that comprises a nozzle for maintaining the device under suction and a thermally compressing means for bonding the outer leads of the device to the substrate.

According to another aspect of the present invention, there is provided an outer lead bonding apparatus which comprises a device supply section on which a plurality of devices punched from a plurality of film carriers are mounted at predetermined respective positions, a transfer head assembly for picking up the devices mounted on the transfer table, a sub-transfer head carried by the transfer head assembly, the sub-transfer head being adapted to pick up each selected device, a sub-transfer head driving means for moving the sub-transfer head in a predetermined direction, a sub-monitoring camera for checking the selected device transferred by the sub-transfer head to a predetermined position for its positional exactness, a transfer table movable by the sub-transfer heed in a predetermined direction, means for driving the transfer head assembly in a predetermined direction, a main monitoring camera for checking the devices picked up by the transfer head assembly for their positional exactness, a substrate driving means for moving the substrates in a predetermined direction prior to receiving the respective devices, a substrate monitoring camera for checking the electrodes of the substrates for their positional exactness.

In a preferred embodiment, the transfer head driving means is controlled so as to compensate for any positional deviation on the basis of the monitoring results of the main monitoring camera.

In another preferred embodiment, the substrate driving means is controlled so as to compensate for any positional deviation of the electrodes of the substrate on the basis of the monitoring results of the substrate monitoring camera.

In a further preferred embodiment, the sub-transfer head driving means is controlled so as to compensate for any positional deviation of the devices on the basis of the monitoring results of the sub-monitoring camera.

In a still further embodiment, the transfer head assembly comprises a plurality of transfer heads and wherein each transfer head comprises a suction nozzle for maintaining the device under suction and a thermally compressing means for bonding the outer leads of the device to the substrate.

In another preferred embodiment, the transfer head assembly driving means reciprocally moves the transfer head assembly in the X direction, the substrate driving means moves the substrate in the Y direction, and the sub-transfer head driving means moves the sub-transfer heads in the X and Y directions.

In a further preferred embodiment, the transfer table is secured to the substrate driving means so as to effect their unitary movement.

Thus, the invention described herein makes possible the objectives of (1) providing an outer lead bonding apparatus capable of speeding up the operation, reducing the working time, (2) providing an outer lead bonding apparatus capable of correcting any positional deviations of devices and substrate, respectively, thereby achieving the exact outer lead bonding, and (3) providing an outer lead bonding apparatus capable of treating various kinds of devices.

BRIEF DESCRIPTION OF THE DRAWINGS

This invention may be better understood and its numerous objects and advantages will become apparent to those skilled in the art by reference to the accompanying drawings as follows:

FIG. 5 is a plan view showing a device used in the apparatus of FIG. 1; and

FIG. 6 is a plan view showing trays for carrying the devices.

DESCRIPTION OF THE PREFERRED EMBODIMENTS

Figure 1:
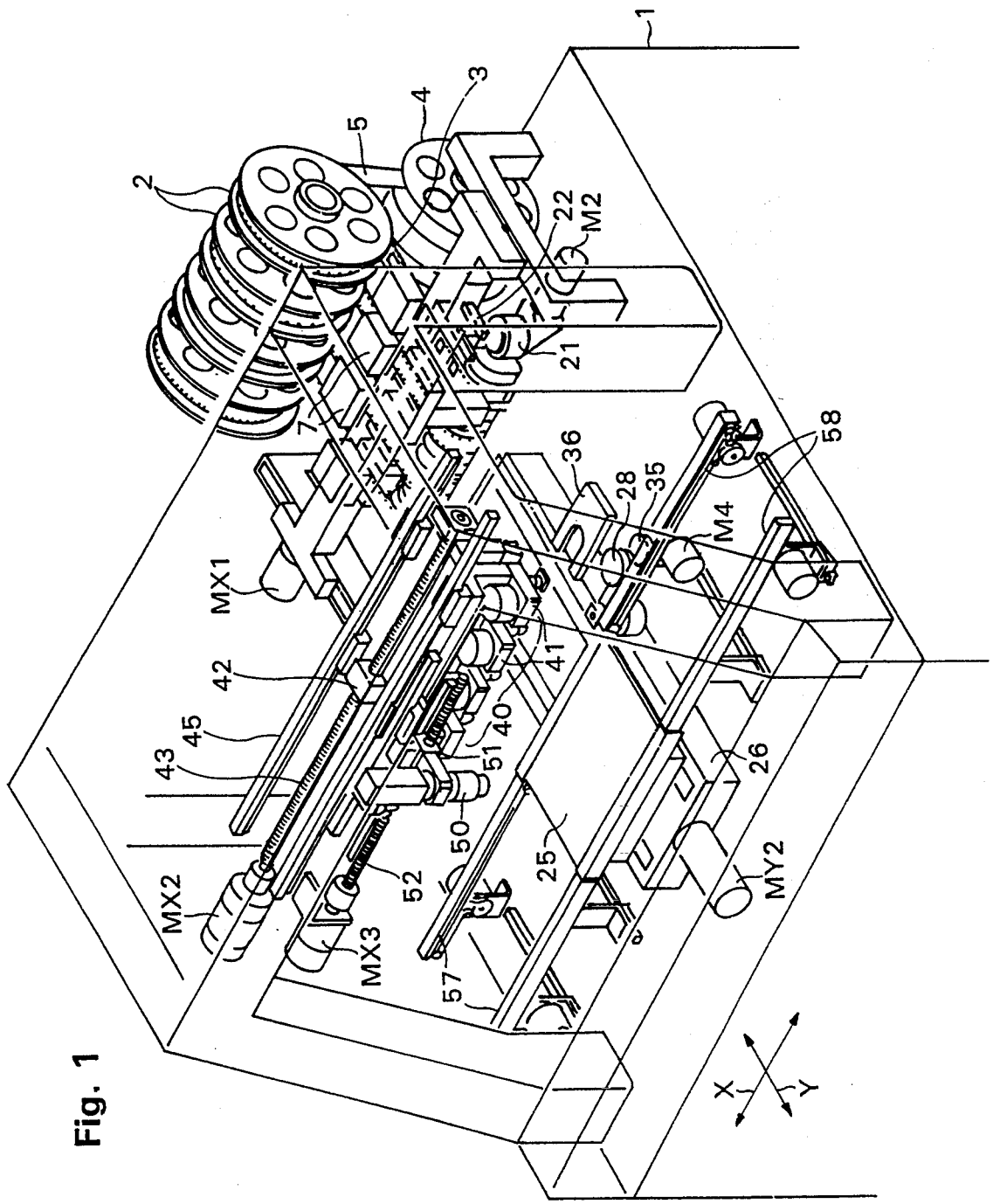
FIG. 1 is a perspective view showing an outer lead bonding apparatus according to the present invention.
Figure 2:
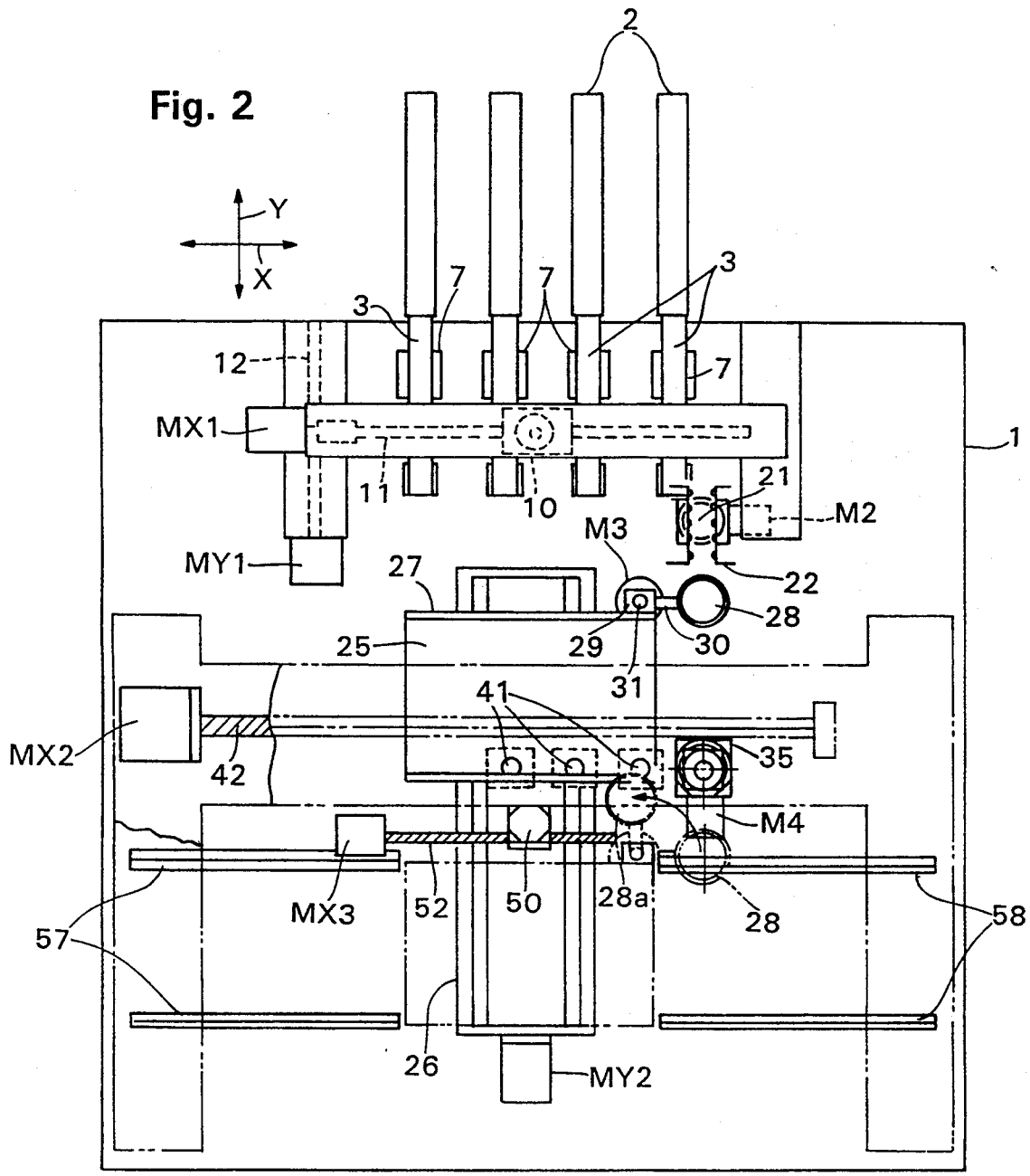
FIG. 2 is a plan view of the apparatus of FIG. 1.
Figure 3:
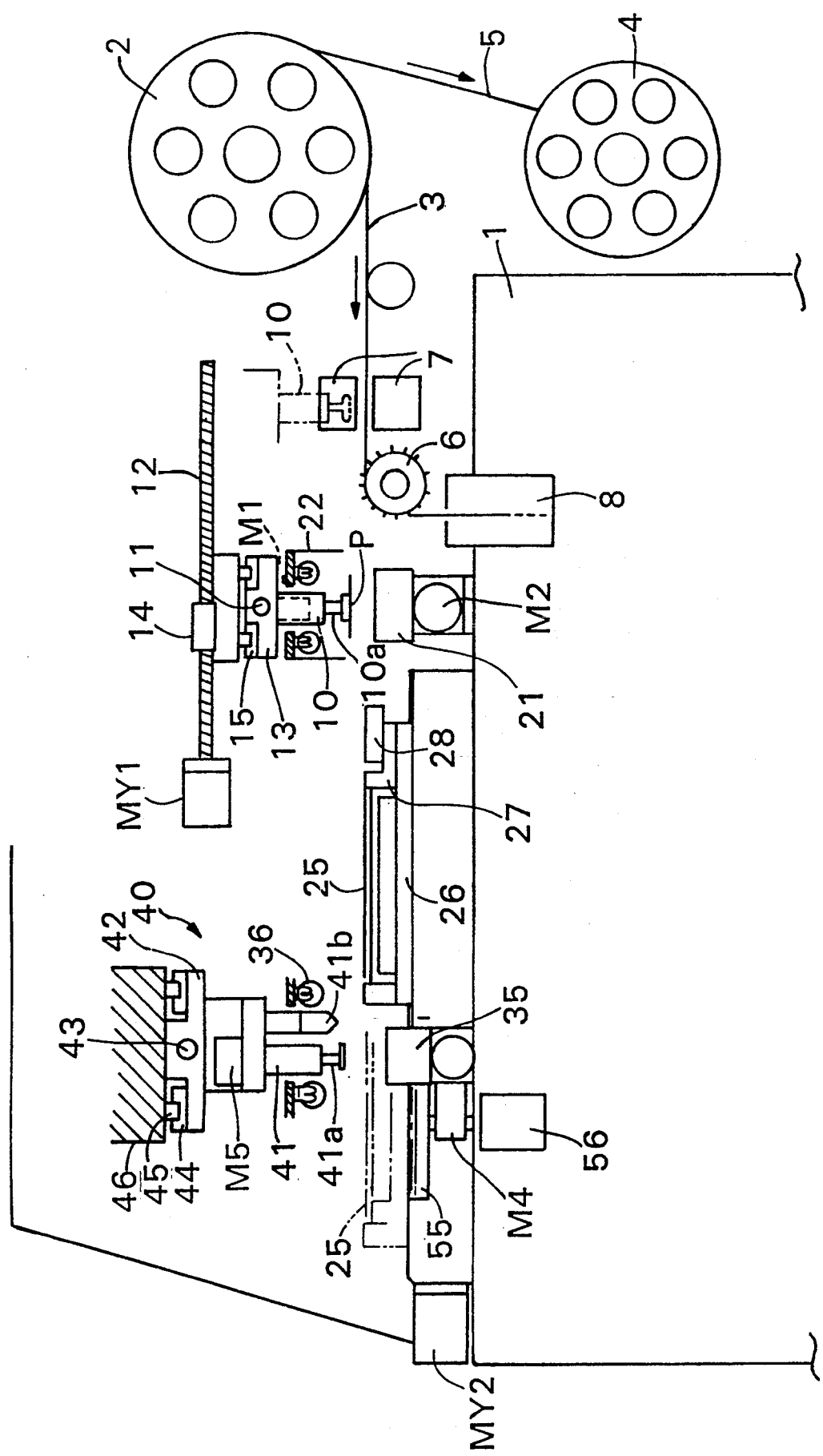
FIG. 3 is a side view of the apparatus of FIG. 1.

Referring to FIGS. 1 to 3, there are provided a main body 1 with a plurality of supply reels 2 (in the illustrated embodiment, four in number). The supply reels 2 carry different kinds of film carriers 3 wherein one kind is on one reel. There are provided spacer tepee 5 wound around reels 4, which are disposed below the respective supply reels 2.

As is shown in FIG. 3, there are provided sprockets 6 in front of the respective supply reel 2 so as to drew the film carriers 3. A cutting tool 7 such as punch is disposed intermediate between each reel 2 end the corresponding sprocket 6 (FIG. 2) for punching devices from the film carriers 3. The leftovers of the film carriers 3 are cut to pieces and collected by a dust collector 8.

A sub-transfer head 10 is disposed above the cutting tools 7. The sub-transfer head 10 moves along an X-direction feed screw 11, and in the X-direction, that is, perpendicular to the direction in which each film carrier 3 is drawn, and also moves along a Y-direction feed screw 12 and in the Y-direction, that is, the direction in which each film carrier 3 is drawn.

There are provided driving motors MX1 and MY1 for driving the feed screws 11 end 12 respectively, which are controlled by suitable control means. Feed units 13, 14 are in thread engagement respectively with the feed screws 11, 12 as shown in FIG. 3. The one feed nut 14 is movable under the guidance provided by guided slider 15. These components MX1, MY1, 11-15 constitute an XY-direction transfer unit for the sub-transfer head 10. The sub-transfer head 10 takes up a device P punched by the cutting device 7 by sucking it by means of a nozzle 10a, and transports it in the X and Y directions. The sub-transfer head 10 takes up a desired device P from one of the four supply stations parallel with the X direction while it moves along in the X direction. The sub-transfer head 10 incorporates a motor M1 which drives the nozzle 10a to rotate in the $\theta$ direction so as to compensate for the $\theta$ directional positional deviation of the device P.

FIG. 5 illustrates a device P which comprises a body sheet 3a punched from the film carrier 3, a semiconductor chip 3b mounted thereon by inner lead bonding, and ultrafine outer leads 3c formed by etching with small pitches at opposite sides of the body sheet 3a. The device P, as will be described in detail hereinafter, must be precisely formed so as to enable the outer leads 3c to be mounted on the electrodes of a circuit pattern printed on substrate.

As shown in FIG. 2, a sub-monitoring camera 21 is disposed beside the front of the sprockets 6, and a light source 22 is disposed above the camera 21. The sub-transfer head 10 takes up and transports each device P to a higher point than the camera 21 so that the device P sucked by the nozzle 10a of the sub-transfer head 10 is checked by the camera 21 for its positional deviations $\Delta x1$, $\Delta y1$, $\Delta\theta1$ relative to the predetermined X, Y, $\theta$ directional positions. The camera 21 is driven by a motor M2 for movement in the X direction. By moving the camera 21 by the motor M2 in the X direction and also by the motor MY1 the sub-transfer head 10 in the Y direction is moved, it is possible to monitor four corners a-d of the device P (see FIG. 5) at a high magnification, thereby accurately detecting any positional deviations $\Delta x1$, $\Delta y1$, $\Delta\theta1$ of the device P. It is noted that positional deviations of the device P of this kind can be accurately detected by four corners, a, b, c, and d of its outer leads 3c.

As shown in FIGS. 2 and 3, the main body 1 is provided in its front portion with a Y table 26 on which is disposed a positioning member 27 by which a substrate 25 is located. A device P punched from a film carrier 3 is mounted on the substrate 25. The substrate 25 is moved by a motor MY2 in the Y direction. The motor MY2 is controlled by suitable control means. A support member 29 is mounted on a rear corner of the positioning member 27, a pin 31 being rotatably fitted in the support member 29. An arm 30 is attached to the pin 31, and at the front end of the arm 30 there is fixed a transfer table 28 for device P. The pin S1 is rotated by a motor M3, and through the rotation of the pin S1 transfer table 28 rotates about the pin 31. The transfer table 28 moves together with the substrate 25 for the transfer of each device P delivered from the head 10 toward a main monitoring camera (which will be described hereinafter). In FIG. 2, the reference numeral 28a denotes a transfer table that has been rotated relative to the substrate 25 moved in the Y direction.

Figure 4:
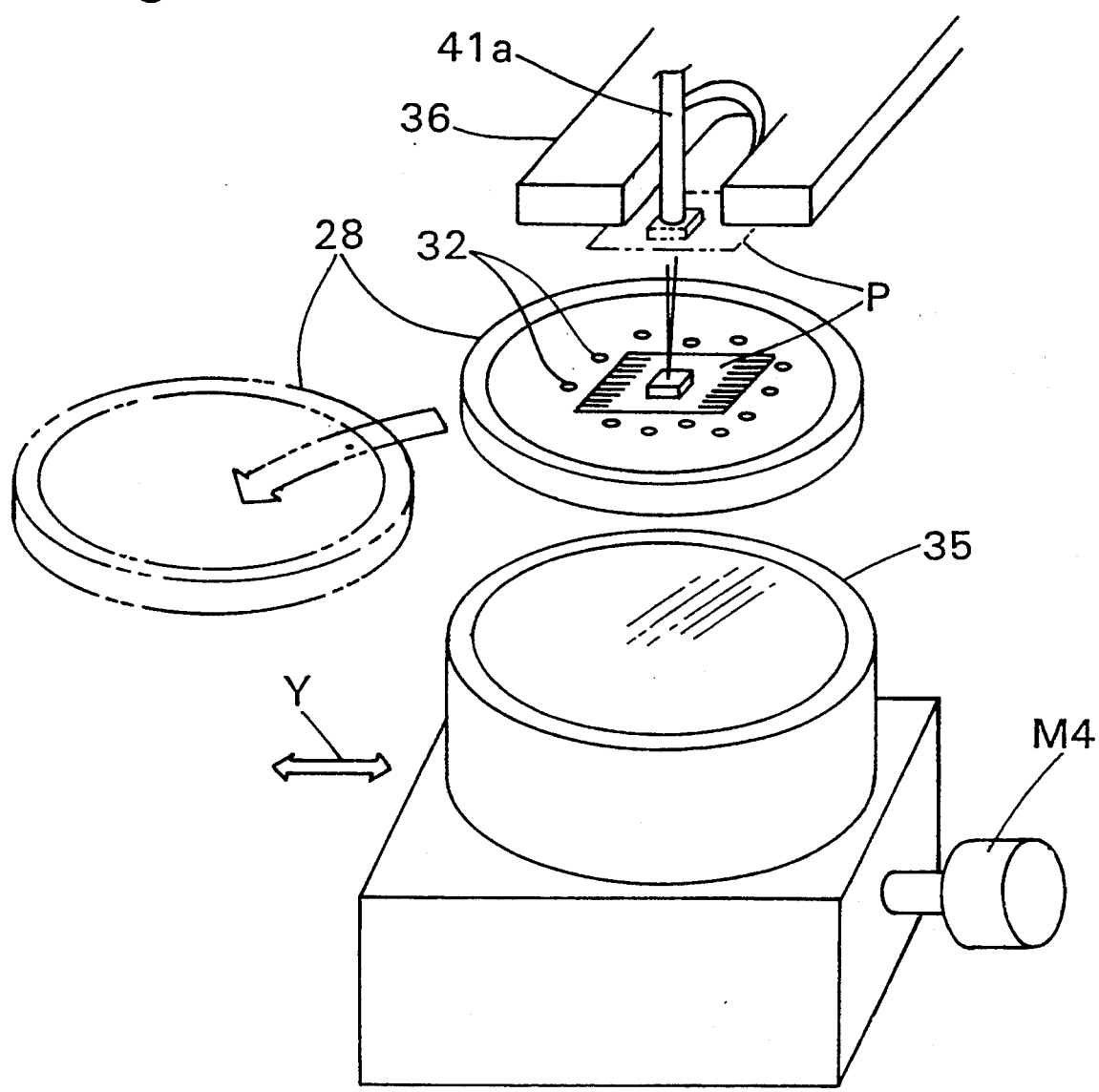
FIG. 4 is a perspective view showing a portion of the apparatus of FIG. 1.

As shown in FIGS. 1 and 4, a main monitoring camera 35 is disposed beside the Y table 26. The transfer table 28 transports device P to a higher point than the camera 35. Above the camera 35 there is provided a light source 36. A nozzle 41a of a main transfer head 41

(which will be described hereinafter) is disposed above the light source 36. When the device P is transported by the transfer table 28 to a take-up position above the camera 35, the nozzle 41a of the main transfer head 41 takes up the device P under suction, and then the motor M3 is driven to move the transfer table 28 aside from the take-up position so as not to allow the transfer table 28 to obstruct the operation of the monitoring camera 35 (see the chain lines in FIG. 4). The main monitoring camera 35 observes the device P maintained under suction provided by the nozzle 41a as to its positional deviations $\Delta x2$, $\Delta y2$, $\Delta \theta 2$ relative to the predetermined X, Y, $\theta$ directional positions of the device. The main monitoring camera 35 moves in the Y direction through the operation of a drive unit consisting of a motor M4, and the nozzle 41a moves in the X direction by a suitable means that will be described hereinafter, whereby the camera 35 observes corner portions a-d of the device P at a high magnification in the same manner as the sub-monitoring camera 21. The transfer table 28 is provided with suction holes 32 for maintaining the device P under suction in order to prevent the device P under transport from shaking.

A main transfer head assembly 40 is disposed above the Y table 26 as shown in FIGS. 1 to 3. The main transfer head assembly 40 includes a plurality of main transfer heads 41 (in the illustrated embodiment four in number) arranged in the X direction. Each of the main transfer heads 41 is provided with a nozzle 41a and a thermo-compression bonding tool 41b. Respective nozzles 41a and respective thermo-compression bonding tools 41b of the main transfer heads 41 are different in shape and size from one another so that they can be selectively used according to the kinds of devices P punched from the film carriers 3. The main transfer head assembly 40 is mounted on an X-direction feed screw 43 through a feed nut 42 and is moved by a motor MX2 in the X direction. The motor MX2, the feed nut 42, and the feed screw 43 constitute an X-directional drive mechanism for the main transfer head assembly 40. In FIG. 3, a support frame 46 is mounted on the main body 1, the support frame 46 being provided with guide rails 45 for the main transfer head assembly 40. Guide sliders 44 are slidably mounted on the guide rails 45, the main transfer head assembly 40 being mounted on the guide slider 44. Each main transfer head 41 incorporates a motor M5 by which its nozzle 41a is driven to rotate on its axis in the $\theta$ direction.

As shown in FIG. 1, a substrate monitoring camera 50 is disposed to examine the substrate 25 above the Y-table 26. The substrate monitoring camera 50 is mounted on a feed screw 52 through a feed nut 51 and is moved by a motor MX3 in the X direction. As FIG. 3 shows, a back-up plate 55 is disposed below the main transfer head 41 the back-up plate 55 being movable upward and downward by means of an elevator cylinder 56. The back-up plate 55 pushes the substrate 25 upward, thereby compensating for any deviation of the substrate 25 during the process of bonding the device P to the substrate 25. As shown in FIG. 1, conveyers 57, 58 for transporting the substrate 25 in the X direction are provided on the main body 1. Means for vertical movement of the nozzles 10a, 41a of individual heads 10, 41 are not shown for simplicity.

In operation, the device P is punched by one of the cutting tools 7 from the film carrier 3 drawn from one of the supply reels 2. The punched device P is picked up and transported to a higher point above the sub-monitoring camera 21 by the sub-transfer head 10. Monitoring is carried out by the sub-monitoring camera 21 of the device P so as to check for its positional deviations $\Delta x1$, $\Delta y1$, $\Delta \theta 1$ in X, Y, $\theta$ directions. The device P is then transferred to the transfer table 28. For this purpose, the motors X1, MY1 are driven by suitable control means to compensate for any positional deviations $\Delta x1$, $\Delta y1$ in the X and Y directions, and then the motor M1 Is driven to compensate for the positional deviation a $\Delta \theta 1$ in the $\theta$ direction. Then, the device P is transferred to the transfer table 28 and mounted on the center thereof. The foregoing compensation of positional deviations is an approximate correction intended to facilitate the precise monitoring of the device P at high magnification in the later stage of monitoring by the main monitoring camera 35 so that the device P can come within the visual angle of the main observation camera 35.

Subsequently, the motor MY2 is driven so that the transfer table 28 is moved to a higher point above the main monitoring camera 35. Thereupon, the device P is picked up under suction provided by the nozzle 41a of one of the main transfer heads 41 which stood by above the main monitoring camera 35; and as shown in FIG. 4, the device P is examined by the main monitoring camera 35 for any positional deviations $\Delta x2$, $\Delta y2$, $\Delta \theta 2$ in the X, Y, and $\theta$ directions.

At the same time, the motor s MY2, MX3 are driven to enable the substrate monitoring camera 50 to monitor the electrodes of the circuit pattern on the substrate 25 on which the device P is to be mounted, thereby compensating for its positional deviations $\Delta x3$, $\Delta y3$, and $\Delta \theta 3$.

Next, the substrate 25 is moved in the Y direction, and the head 41 by which the device P is picked up is moved in the X direction, whereby the device P is mounted on the terminal area (electrode area). At this stage, the motors MX2, MY2 are driven for compensation of the X, W directional positional deviations $\Delta x2 + \Delta x3$, $\Delta y2 + \Delta y3$, and the motor M5 provided in the main transfer head 41 is driven for compensation of the positional deviation $\Delta \theta 2 + \Delta \theta 3$, whereby the outer leads 3c are accurately mounted on the substrate 25 at the electrodes thereof. This compensation is a precision correction for enabling the outer leads 3c to be secured to the electrodes. Then, the thermo-compression bonding tool 41b is pressed against the outer leads 3c while the device P is pressed by the nozzle 41a against the substrate 25, whereby the outer leads 3c are bonded by thermo-compression bonding.

While the device P is being bonded to the substrate 25 in this way, the sub-transfer head 10 takes up a next device P punched from a film carrier 3 drawn from one of the supply reels 2, and transports it to a higher point above the sub-monitoring camera 21, then transferring the device P to the transfer table 28. Thereafter, the same process of operation continues as described above.

In the above described operation, the apparatus of the invention exhibits the following advantages:

The operation of transferring a device P from the device supply unit to the substrate 25 is performed by three different transfer means, namely, the sub-transfer head 10, the transfer table 28, and the main transfer head(s) 41, and accordingly, necessary strokes of the individual transfer means being so much shorter than otherwise, necessary cycle time is thus reduced. Moreover, while the device P is being transferred to and mounted on the substrate 25 by one of the main transfer heads 41 of the main transfer head assembly 40, the sub-transfer head 10 takes up a next device P from the device supply section and transports it to a little higher position above the sub-monitoring camera 21, then the main transfer head assembly 40 can move to a higher point above the main monitoring camera 35 to stand by while the transfer table 28 is transporting device P to the main monitoring camera 35. In addition, the substrate monitoring camera 50 can observe any positional deviation of the electrodes of the substrate 25 while the device P is picked up by the main transfer head 41 of the main transfer head assembly 40 and is being examined by the main monitoring camera 35 for its positional deviations.

In this way, the individual operation means 10, 28, 41, and 50 can perform their own functions in cooperation with one another within a predetermined period of time while operating independently of one another. This enhances the operational efficiency and saves time, thereby speeding up the outer lead bonding process. Furthermore, the sub-transfer head 10 can be caused to selectively pick up any desired device P punched from the film carrier at the device supply section while it moves in the X direction, and the device P is picked up by an appropriate one of the main transfer heads 41 of the main transfer head assembly 40, and mounted on the substrate 25.

In the foregoing embodiment, the device supply section is such that a film carrier 3 is drawn from each supply reel 2 and a device P is punched from the film carrier 3 by a corresponding cutting tool 7, the device P being then picked up by the sub-transfer head 10. Alternatively, the device supply section may be such that, as shown in FIG. 6, the devices P punched from different film carriers are placed by kinds on trays 6 so that the devices P on the trays 6 can be selectively picked up by the sub-transfer head 10.

According to the invention, as described above, the devices P punched from film carriers are transferred to a substrate and mounted thereon by the sub-transfer heads, transfer table, and main transfer heads, which are independently operated in cooperation with one another so that the sub-transfer head transfers the device P to the transfer table, and the transfer table transfers it to one of the main transfer heads, which in turn transfers the device to a substrate. Thus, the operating efficiency is enhanced and time is saved.

Any positional deviation is monitored and compensated by two steps; the first step is by approximate correction and the second is by precise correction, and at the same time, the positional exactness of the substrate is maintained. Therefore, a precise outer lead bonding is effected. Furthermore, when many kinds of devices are treated and sent to the supply section, it can be arranged that the number of main transfer heeds corresponding to that of the kinds of devices are mounted on the transfer head assembly so that the devices can be individually bonded to the substrate.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method of bonding outer leads of devices to electrodes of substrates comprising the steps of:
arranging a plurality of devices at predetermined respective positions at a device supply section;
picking up the devices from the device supply section using a sub-transfer head assembly;
checking the picked up devices for positional deviation from a plurality of first predetermined position using a sub-monitoring camera;
moving the sub-transfer head assembly in a first predetermined direction using a sub-transfer driving means for adjusting the location of the devices picked up by the sub-transfer head assembly on the basis of the result of the checking by the sub-monitoring camera;
placing the devices on a transfer table means and moving the transfer table means in a second predetermined direction toward a main transfer head assembly which includes a plurality of suction nozzles for maintaining the devices under suction and a thermal compression means for bonding the outer leads of the devices to the substrates;
picking up the devices from the transfer table means using the main transfer head assembly;
checking the devices picked up by the main transfer head assembly for positional deviation from a plurality of second predetermined positions using a main monitoring camera;
moving the main transfer head assembly in a third predetermined direction on the basis of the result of the checking by the main monitoring camera using a main transfer driving means;
checking the electrodes of the substrates for positional deviation from a predetermined position using a substrate monitoring camera;
moving the substrates in a fourth predetermined direction on the basis of the result of the checking by the substrate monitoring camera using a substrate driving means; and
placing the devices on the substrates and bonding the outer leads of the devices to the electrodes of the substrates.

2. A method of bonding outer leads of devices to electrodes of substrates comprising the steps of:
picking up a device from a device supply section on which a plurality of devices are arranged at predetermined respective positions using a sub-transfer head assembly including a first suction nozzle for maintaining the device under suction;
checking the picked up device for positional deviation from a first predetermined position using a sub-monitoring camera;
moving the sub-transfer head assembly in a horizontal direction using a sub-transfer driving means for adjusting the location of the device picked up by the sub-transfer head assembly on the basis of the result of the checking by the sub-monitoring camera;
placing the device on a transfer table means and moving the transfer table means in a predetermined direction toward a main transfer head assembly;
picking up the device from the transfer table means using the main transfer head assembly which includes a second suction nozzle for maintaining the device under suction and a thermal compression means for bonding the outer leads of the device to the substrate;

checking the device picked up by the transfer head assembly for positional deviation from a second predetermined position using a main monitoring camera;

moving the main transfer head assembly and the substrate on the basis of the result of the checking by the main monitoring camera using a substrate driving means; and placing the device on the substrate and bonding the outer leads of the device to the electrodes of the substrate.

3. A method of bonding outer leads of a device to electrodes of a substrate comprising the steps of:

drawing a film carrier from a film carrier supply reel;

cutting a device having outer leads from the film carrier;

positioning the cut device on a transfer table using a sub-transfer head assembly;

monitoring the positioning of the cut device for positional deviation using a sub-monitoring camera;

moving the transfer table in a predetermined direction;

positioning the cut device over a substrate using a transfer head assembly;

monitoring the positioning of the cut device for positional deviation using a main monitoring camera;

moving the substrate so that the substrate electrodes are in alignment with the outer leads of the device using a substrate driving means;

checking the electrodes of the substrate for positional deviation using a substrate monitoring camera; and placing the device on the substrate and bonding the outer leads of the device to the electrodes of the substrate.

4. The method of claim 3 further comprising the step of controlling the transfer head assembly to compensate for any positional deviation of the device as determined by the main monitoring camera.

5. The method of claim 3 further comprising the step of controlling the substrate driving means to compensate for any positional deviation of the substrate as determined by the substrate monitoring camera.

6. The method of claim 3 further comprising the step of controlling the sub-transfer head assembly to compensate for any positional deviation of the device as determined by the sub-monitoring camera.

7. The method of claim 3 wherein the transfer head assembly comprises a plurality of transfer heads, each transfer head including a suction nozzle for maintaining a device under suction and a thermally compressing means for bonding the outer leads of the device to the electrodes of the substrate, so that a plurality of different type devices can be bonded to substrates at the same time.

8. The method of claim 3 further comprising the steps of:

controlling the transfer head assembly to compensate for any positional deviation of the device as determined by the main monitoring camera;

controlling the sub-transfer head assembly to compensate for any positional deviation of the device as determined by the sub-monitoring camera; and controlling the substrate driving means to compensate for any positional deviation of the substrate as determined by the substrate monitoring camera.

9. The method of claim 7 wherein the sub-transfer head assembly moves the device in both a horizontal and a vertical direction, the transfer head assembly moves the device in a horizontal direction, and the substrate driving means moves the substrate in a vertical direction.

* * * * *